United States Patent [19]

Abernathey et al.

[11] Patent Number: 4,556,585

[45] Date of Patent: Dec. 3, 1985

[54] VERTICALLY ISOLATED COMPLEMENTARY TRANSISTORS

[75] Inventors: John R. Abernathey, Jericho; Charles W. Koburger, III, Underhill, both of Vt.

[73] Assignee: International Business Machines Corporation, Armonk, N.Y.

[21] Appl. No.: 695,716

[22] Filed: Jan. 28, 1985

[51] Int. Cl.⁴ .............................................. B05D 5/12
[52] U.S. Cl. ........................................ 427/85; 427/86
[58] Field of Search .................................... 427/85, 86

[56] References Cited

U.S. PATENT DOCUMENTS 4,137,109 1/1979 Aiken et al. ........................... 148/175
4,346,513 8/1982 Nishizawa et al. ................... 29/580
4,476,623 10/1984 El-Kareh .............................. 29/576

Primary Examiner—James R. Hoffman
Attorney, Agent, or Firm—Francis J. Thornton

[57] ABSTRACT

A process for making complementary transistor devices in an epitaxial layer of a first conductivity type having a deep vertical isolation sidewall between the N and P channel transistors by providing a backfilled cavity in the epitaxial layer, the sidewalls of the cavity being coated with layers of material, the first layer being a silicate doped with the same conductivity type as the epitaxial layer in contact with the epitaxial layer and overcoated with an isolation and diffusion barrier layer, the second silicate layer doped to a conductivity opposite to that of the first layer and isolated therefrom by said isolation and diffusion barrier material. The cavity is backfilled with semiconductor material of a conductivity type opposite to that of the epitaxial layer and during this backfilling operation the dopants in the first and second layer outdiffuse into the epitaxial layer and into the backfill material respectfully to prevent the creations of parasitic channels.

5 Claims, 10 Drawing Figures

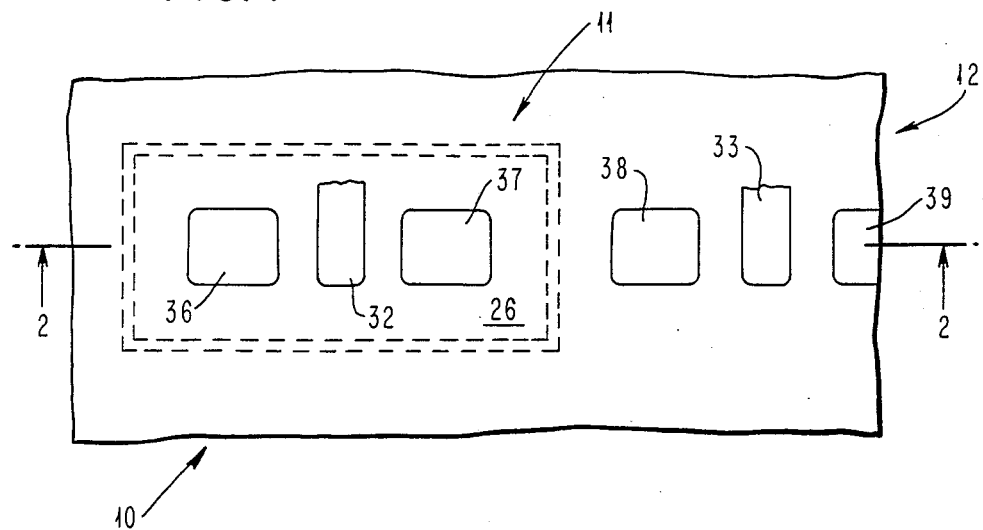
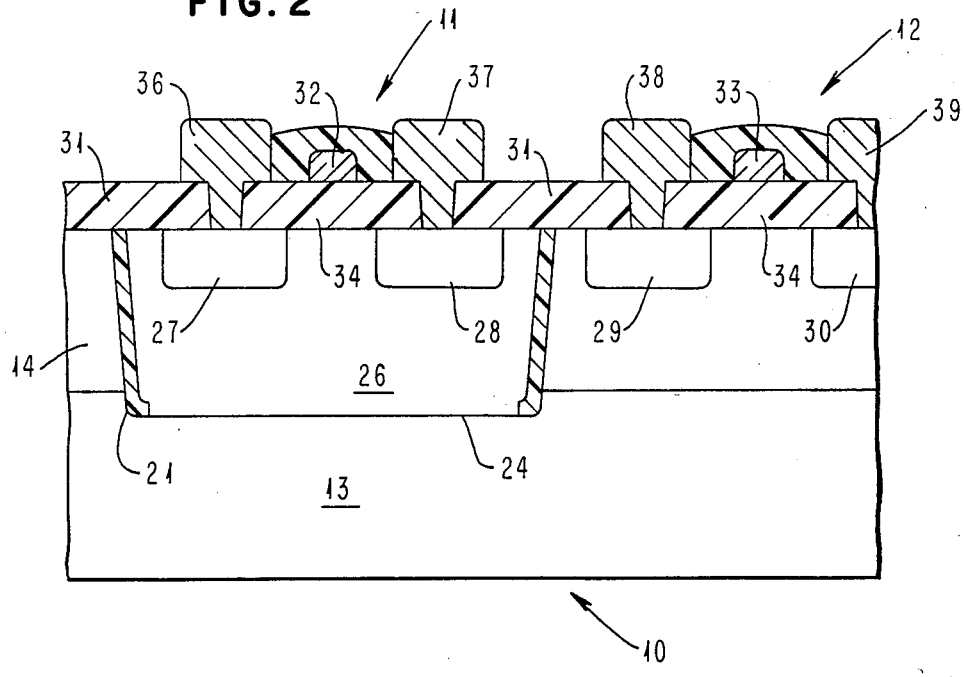

VERTICALLY ISOLATED COMPLEMENTARY TRANSISTORS

BACKGROUND OF THE INVENTION

1. Field of the Invention

This invention relates to complementary semiconductor devices and more particularly to improved complementary transistors having significantly improved isolation.

2. Description of the Prior Art

U.S. Pat. No. 4,346,513 discloses a method that includes etching a substrate to form depressions, doping their sidewalls and filling the depressions with an epitaxial layer.

U.S. Pat. No. 4,137,109 discloses a process which includes etching apertures in the substrate, doping the sidewalls to form channel stop regions, and filling the apertures with $SiO_2$.

The above listed prior art shows the use of trenches and refilling the trenches with insulating materials for isolating active device regions in a substrate or an epitaxial layer. It is also known that the sidewalls of the trenches can be doped to form channel stopping regions and that the trenches can be filled with epitaxially grown material.

This prior art however fails to show how to incorporate these techniques in a process for making complementary transistor structures.

SUMMARY OF THE INVENTION

It is an object of the present invention to provide a more efficient complementary transistor structure.

It is a further object of the present invention to provide a complementary transistor structure having a unique isolation structure built on the sidewalls of the trenches for separating the P from the N well regions.

It is still a further object of the present invention to provide a complementary transistor structure that uses N-type glass on the side of the N-well and P-type glass on the side of the P-well with an intervening isolation material; the composite being narrower than the smallest lithographically definable width therebetween.

It is an additional object of the present invention to provide a smaller complementary transistor structure.

All of these features and advantages are realized in a process for making complementary transistors in an epitaxial layer having a deep vertical isolation sidewall between N and P channel devices by providing a cavity in the epitaxial layer, the sidewalls of which are formed to have a P-type doped glass on one side of the P-type portion of the layer and an N-type doped glass on the opposite side and between the two glasses a layer of silicon oxynitride to act as an isolating diffusion barrier and filling the cavity with material having a conductivity of the opposite type to that of the epitaxial layer.

The foregoing and other objects, features and advantages of the invention will be apparent from the following more particular description of the preferred embodiment of the invention, as illustrated in the accompanying drawings.

DESCRIPTION OF THE DRAWINGS

FIG. 1 is a plan view of the surface of an array complementary transistor built in accordance with the present invention, in integrated circuit form.

FIG. 2 is a sectional view of the array of FIG. 1 taken along the lines 2—2 of FIG. 1.

DESCRIPTION OF THE PREFERRED EMBODIMENT

Turning now to the figures, a full description of the invention will be given.

Turning especially to FIG. 1, FIG. 2 and FIGS. 3 through 10 there is shown in FIGS. 1 and 2 and, in accordance with the present invention, an array 10 containing both P and N channel, i.e., complementary transistors. Specifically, for purposes of description only, transistor 11 is shown as a P channel transistor and transistor 12 as an N channel transistor. Only the P channel transistor 11 is shown complete. FIGS. 3 through 10 show the process for making the improved structure of the array 10.

Figure 3:
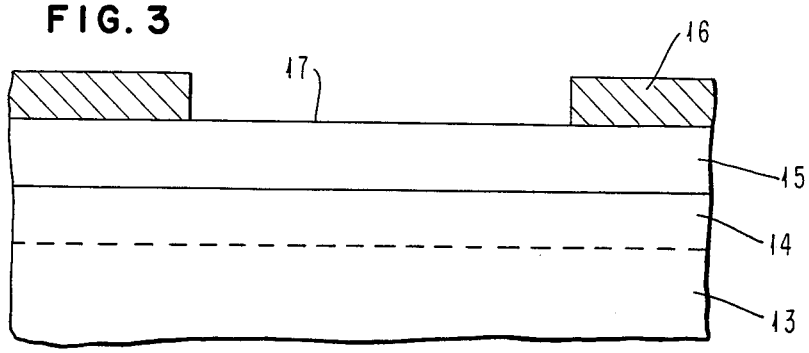
FIGS. 3 through 10 shows the various stages of formation of the improved structure of the invention.

As shown in FIG. 3 a substrate 13 of P+ silicon having a resistivity of <0.1 ohm-cm is treated with known techniques such that there is formed thereon a P-type epitaxial layer, having resistivity of about 10 ohm-cm 14, of the same semiconductor material as the substrate.

Once this layer 14 has been formed or grown to the desired thickness, i.e., usually less than 5 microns thick, the unit is treated, as described in the steps below, to create an isolated pocket 26 which encloses the P channel transistor 11. This pocket is formed by cutting a cavity through the P— epitaxial layer, coating the cavity walls with selected layers which are then selectively treated and or removed and backfilling the cavity with N— silicon. This formed isolation pocket is such that it penetrates the entire thickness of the P— epitaxial layer so that the backfilled N-type silicon merges with the P+ substrate.

Once the epitaxial region 14 is fully grown it is coated with a thick oxide 15 which in turn is coated with a photoresist layer 16. The oxide layer 15 must be at least approximately 20% of the thickness of the epitaxial layer.

Figure 4:
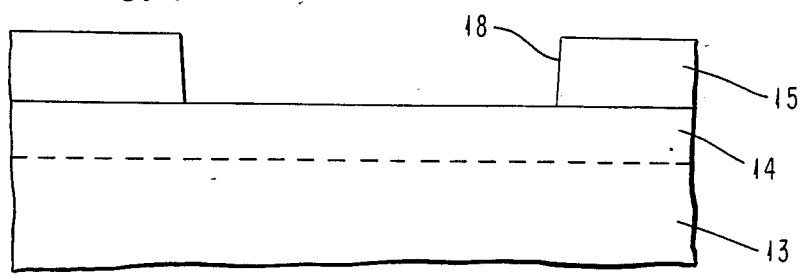

As shown in FIG. 3 the photoresist layer 16 is then exposed and developed using the well known photolithographic techniques to create an opening 17 therein. Through this formed opening 17 in the photoresist layer 16 a window 18 is, as shown in FIG. 4, opened in the oxide layer 15 by using a known etching technique such as chemical etching.

Once the window 18 is created in the oxide layer 15 the photoresist layer 16 is removed and the unit is placed in a reactive ion etching chamber. One ion etching process comprises the introduction of reactive material in vapor form into the chamber with the device to be etched. This vapor is ionized using a plasma so that reactive ions of the reactive material are formed. These ions are then directed against the surface of the device which is to be etched. One process for producing such cavities from 0.5 um to 3.0 um deep, with a profile of 85°, using thermal oxide and photoresist as masking material, uses a mixture of oxygen $O_2$ and dichlorodifluoromethane $CCl_2F_2$, (also known as Freon 12).

Specifically P type, single crystal silicon, 100 mm wafers having a 1.0 um $SiO_2$ coating thereon overlaid with a thick photoresist layer were etched in a chamber having a 30 um cathode. The conditions in the chamber were pressure, 12 mtorr, power density 0.34 w/cm² and gas flows of 20 SCCM of oxygen ($O_2$) together with 24 sccm of dichlorodifluoromethane ($CCl_2 F_2$).

The etch rates of the wafer, the oxide and the photoresist, under the above conditions was;

Silicon Wafer 28 to 30 nm/min.
Thermal Oxide 8.2 to 13.5 nm/min.
Photoresist 27 to 35.7 nm/min.

Figure 5:
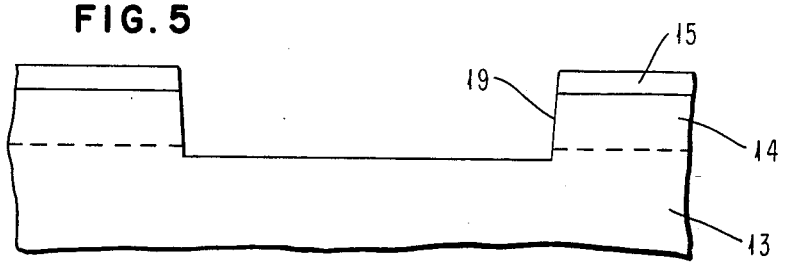

This technique creates, as shown in FIG. 5, a cavity 19 in the P— epitaxial layer 14 under the oxide window 18. Preferably the oxide layer 15 should be thick enough that when the cavity 19 extends through the epitaxial layer 14, as shown in FIG. 5, approximately 500 to 1000 Å of layer 15 remains on the surface of layer 14. This remaining layer 15 serves as a nucleation barrier for later selective epitaxial silicon deposition.

Figure 6:
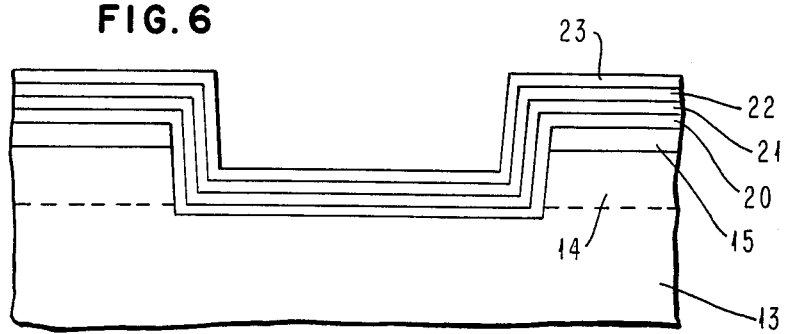

Once this cavity 19 is formed the unit is removed from the reactive ion etching apparatus and placed in a chemical vapor deposition (CVD) chamber into which gases containing boron, oxygen and silicon are passed over it. The unit is maintained in the chamber for a length of time sufficient to create upon the exposed silicon, i.e., the walls and the bottom of the cavity 19 as well as an oxide layer 15 as shown in FIG. 6, a layer of borosilicate glass 20. This borosilicate layer 20 may range from 100 angstroms in thickness to 500 angstroms in thickness and is shown in FIG. 6. This borosilicate glass is formed by placing the wafer in the CVD chambers in the presence of silane ($SiH_4$), oxygen ($O_2$) and diborane ($B_2H_6$).

Specifically, the conditions are as follows. The temperature of the chamber is raised to about 400° C.: the gases are simultaneously introduced at the following flow rates; the silane at 25 to 100 SCCM the oxygen at 0.25 to 1.0 SEM and the diborane is 10% diborane in nitrogen ($N_2$) at a flow rate of 0.25 to 1.0 SLM: the pressure is maintained at 0.2 to 0.5 torr: the time is from 10 to 40 minutes.

Once the walls of the cavity have been lined with the borosilicate layer 20 the unit is treated with suitable mixtures of silicon, oxygen, and nitrogen to form a suitably thick (100–1000 Å) silicon oxynitride layer 21. Specifically the conditions necessary to create layer 21 are: dichlorosilane $SiH_2Cl_2$ at 10 to 50 SCCM is followed into the CVD chamber together with nitrous oxide ($N_2O$) and ammonia ($NH_3$) at 10–70 SCCM for between 10 and 50 minutes while the pressure of the chamber is held between 0.25 and 0.35 torr and the temperature of the chamber is approximately 825° C.

Following the formation of this layer, gases containing oxygen, silicon and either phosphorus or arsenic are introduced to form a layer 22 of phosphosilicate or arsinosilicate glass on the silicon oxynitride layer. This layer will range between 100 and 500 Å in thickness. Preferably phosphosilicate glass is formed by introducing into the CVD chamber silane ($SiH_4$) at 25–100 SCCM together with oxygen ($O_2$) at 0.25–1.0 SLM and 10% phosphine ($PH_3$) in nitrogen ($N_2$) at 0.1–0.75 SLM while maintaining a pressure of 0.2 to 0.5 torr and a temperature of approximately 400° C.

Figure 7:
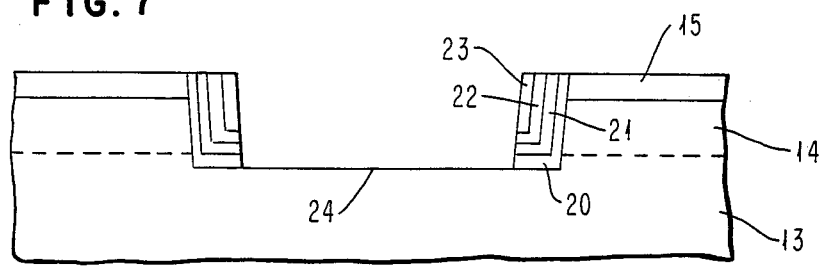

To create arsenosilicate glass instead of the phosphosilicate glass arsine ($AsH_3$) can be substituted for the phosphine. All the other conditions and gases remain the same. Over this glass layer 22 there is now formed a silicon nitride ($Si_3N_4$) layer 23. Once all these chemical vapor deposition processes are completed the unit is removed from the chamber and placed in a reactive ion chamber. Any suitable reactive ion process, such as the one previously described is performed for a time sufficient to remove the layers 20, 21, 22, and 23 from the bottom of the cavity 19 and top of layer 15 as shown in FIG. 7. This exposes the underlying surface 24 of the substrate 13.

Because the reactive ion etching process is a direct line of sight process the effect of it on the layers 20, 21, 22, and 23 on the sides of the cavity 19 are insignificant and for all effects and purposes those layers remain substantially untouched and undiminished in thickness.

Figure 8:
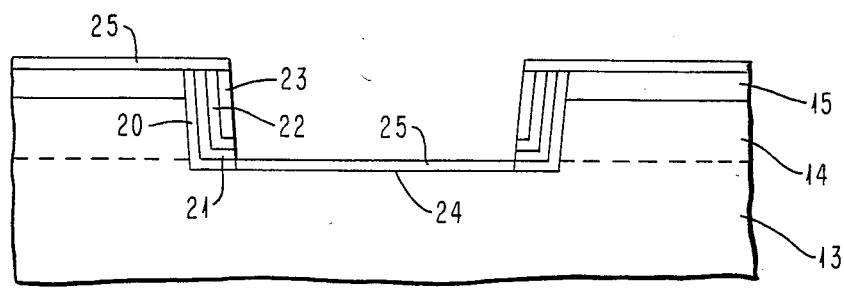
Figure 9:
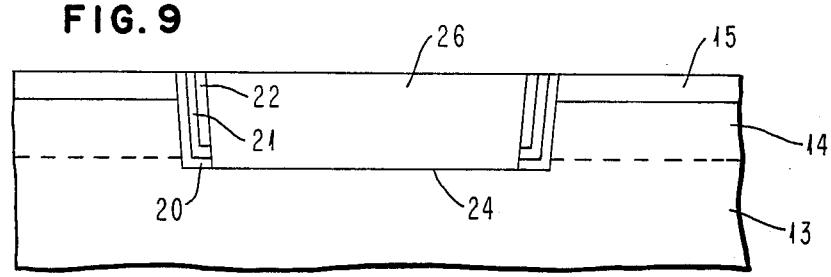
Figure 10:
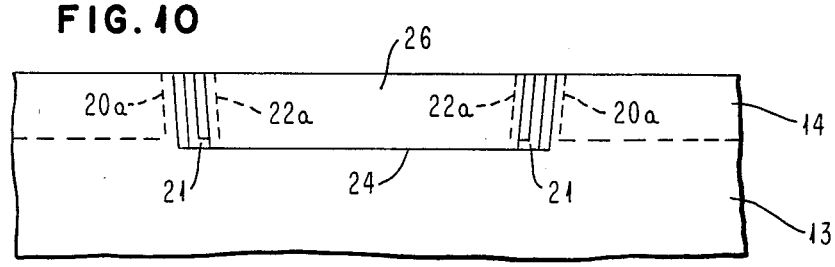

Once the layers 20, 21, 22, and 23 in the bottom of the cavity have been removed the unit is placed into an oxidizing chamber to form, as shown in FIG. 8, a 200 Å to 500 Å thick layer 25 of silicon oxide over the surfaces 24 and 15 not protected by $Si_3N_4$. Silicon oxide will not under these conditions form on the surface of the silicon nitride layer 23. This layer 25 effectively heals any damage done to the exposed silicon surface 24. Once this oxide layer 25 is formed it is immediately removed using a suitable buffered hydroflouride acid etch. This etch must be controlled to leave a significant thickness of layer 15 on the surface of the array while completely exposing surface 24. Following this, the silicon nitride layer 23 is removed from the walls of the cavity by etching with hot phosphoric acid. Once the nitride layer 23 has been removed the array is placed into a reduced pressure chemical vapor deposition apparatus and exposed to a silicon containing vapor, such as dichlorosilane or silicon tetrachloride, mixed with an N-type dopant material such as arsenic or phosphorous at a pressure of 80–150 torr and a temperature of 1050°–1150° C. By using this well known chemical vapor deposition an N-doped silicon pocket 26 can be formed in the cavity 19 as shown in FIG. 9. The silicon material 26 in this pocket is single crystal material because removal of the oxide 25 at the bottom of the cavity 19 and exposure of the surface 24 allows the deposited silicon to merge with and form a good crystallographic connection with the substrate 13.

Any excess material formed over and above the surface of the cavity can be easily removed by well known techniques such as a planarization technique.

During the above described epitaxial deposition process of the N-type silicon material 26, in the cavity 19, dopants from the layers 20 and 22 outdiffuse into the silicon that they are in contact with. Thus, the dopant species from layer 20 outdiffuse into the layer 14, and those from layer 22 outdiffuse onto the epitaxially grown material 26. In this way these layers 20 and 22 serve as doping sources to prevent parasitic channels from being created along the sides of isolating layer 21. The extent of this outdiffusion is shown by dotted lines 20a and 22a.

In this way there is formed a dielectric material lined, silicon filled pocket. The silicon fill material 26 in the pocket makes a good electrical connection with the substrate 11 but remains isolated, by a wall of oxide-nitride 21, from the surrounding P-type epitaxial layer 14.

Subsequently, known techniques are employed to fabricate MOS devices. Typically, a thick oxide layer 31, is formed over inactive surface areas. Thinner dielectrics 34, usually 150 to 500 Å thick, are formed in active device regions. Then, as shown in FIG. 2, two P-type regions 27 and 28 are formed by well known diffusion techniques in the upper surface of the silicon fill material 26. These regions 27 and 28 are each a PN junction with the underlying N-type epitaxial material 26. Similarly, two N-type regions 29 and 30 are formed in layer 14. A conductive material, typically polycrystalline silicon is then employed to form insulated gates 32 and 33. Over the respective diffusions 27, 28, 29, and 30 conductive material, i.e., aluminum dots 36, 37, 38, and 39 are then placed to make contact with the respective underlying regions 27, 28, 29, and 30. This forms a complementary transistor array consisting of a P channel and an N channel transistor.

The P channel transistor 11 is thus comprised of pocket 26, gate 32 and region 27 which serves as its source, and region 28 which serves as its drain.

The N channel transistor 12 is defined by gate 33, and region 29 which serves as its source and region 30 which acts as its drain.

While the invention has been particularly shown and described with reference to the particular embodiment thereof, it will be understood by those skilled in the art that changes may be made therein without departing from the spirit and scope thereof.

What is claimed is:

1. A method of forming an improved semiconductor comprising the steps of:
    providing a substrate of first conductivity type semiconductor material,
    growing an epitaxial layer of the same conductivity type semiconductor material on said substrate,
    etching through said epitaxial layer to said substrate, to form a cavity in said epitaxial layer,
    coating the walls of said channel with a series of layers of insulating material, and
    depositing semiconductor material of a second conductivity type in said cavity on said substrate and between said coated walls, said deposited semiconductor material being in intimate contact with said substrate and isolated from said epitaxial layer by said coated walls.

2. A method for producing an improved complementary transistor memory cell comprising the steps of:
    providing a silicon substrate of a first conductivity type semiconductor material,
    growing a silicon epitaxial layer of said first conductivity type material on a surface of said substrate,
    reactive ion etching an opening through said epitaxial layer to said substrate to expose said surface of said substrate forming a cavity in said epitaxial layer,
    forming a series of coatings of insulating materials on the bottom and walls of said cavity,
    reactive ion etching the insulating material from the bottom of the cavity to again expose the surface of the substrate in the bottom of the cavity.
    depositing a semiconductor material of a second conductivity type as said substrate on said exposed bottom surface in said cavity and in contact with said coated walls thereby forming a pocket in which to form a transistor cell complementary to a transistor cell in said epitaxial layer.

3. The process of claim 1 wherein said etching is reactive ion etching.

4. The process of claim 1 wherein said epitaxial layer and said substrate are silicon and the walls of said channel are coated with a first chemically deposited silicate containing first type conductivity type dopants, a second layer of an isolation and diffusion barrier material and a third layer of chemically deposited silicate containing second type conductivity type dopants.

5. The process of claim 4 wherein there is further provided the step of removing any coating material on the bottom of said cavity to expose the surface of said substrate.

* * * * *